(12) United States Patent
You

(10) Patent No.: US 8,445,915 B2
(45) Date of Patent: May 21, 2013

(54) ORGANIC LIGHT-EMITTING DISPLAY DEVICE AND METHOD OF MANUFACTURING THE SAME

(75) Inventor: Chun-Gi You, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/239,202

(22) Filed: Sep. 21, 2011

(65) Prior Publication Data

US 2012/0286281 A1 Nov. 15, 2012

(30) Foreign Application Priority Data

May 13, 2011 (KR) ........................ 10-2011-0045119

(51) Int. Cl.
*H01L 51/50* (2006.01)
(52) U.S. Cl.
USPC ................................ 257/72; 257/449; 438/34
(58) Field of Classification Search
USPC   257/72, 288, 59, 291, 449, E51.027; 438/34; 313/631
See application file for complete search history.

(56) References Cited

U.S. PATENT DOCUMENTS

| 7,319,243 | B2 * | 1/2008 | Kim ................................ 257/98 |
| 2007/0063194 | A1 | 3/2007 | Feng et al. |
| 2009/0140283 | A1 * | 6/2009 | Kawakami et al. ............. 257/99 |
| 2010/0193790 | A1 * | 8/2010 | Yeo et al. ........................ 257/59 |

FOREIGN PATENT DOCUMENTS

| KR | 10-2004-0037889 A | 5/2004 |
| KR | 10-2007-0003587 | 1/2007 |
| KR | 10-2007-0059877 A | 6/2007 |
| KR | 10-2009-0120698 A | 11/2009 |

* cited by examiner

*Primary Examiner* — N Drew Richards
*Assistant Examiner* — Christina Sylvia
(74) *Attorney, Agent, or Firm* — Christie, Parker & Hale, LLP

(57) ABSTRACT

An organic light-emitting display device includes a thin film transistor (TFT) including an active layer, a gate electrode comprising a first electrode and a second electrode, a source electrode, and a drain electrode, a photoresist layer on the source electrode and the drain electrode, a pixel electrode electrically coupled to the TFT, comprising a same material as the first electrode, and at a same layer as the first electrode, a pixel defining layer having a hole exposing the pixel electrode, the pixel defining layer covering the photoresist layer, an intermediate layer on the pixel electrode and comprising a light-emitting layer, and an opposite electrode covering the intermediate layer and facing the pixel electrode.

21 Claims, 12 Drawing Sheets

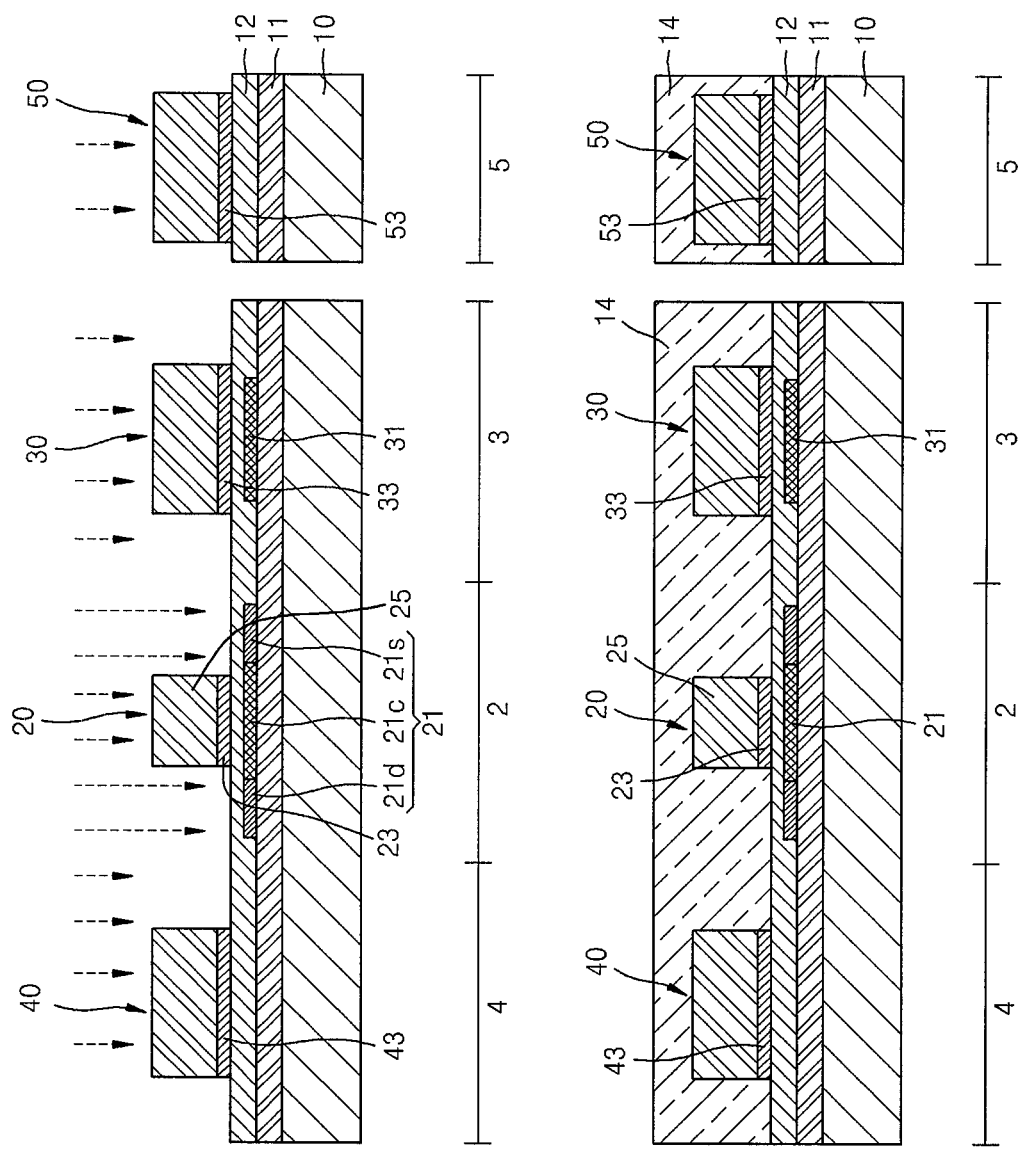

ORGANIC LIGHT-EMITTING DISPLAY DEVICE AND METHOD OF MANUFACTURING THE SAME

CROSS-REFERENCE TO RELATED PATENT APPLICATION

This application claims priority to and the benefit of Korean Patent Application No. 10-2011-0045119, filed on May 13, 2011, in the Korean Intellectual Property Office, the disclosure of which is incorporated herein in its entirety by reference.

BACKGROUND

1. Field

One or more aspects of embodiments of the present invention relate to an organic light-emitting display device and a method of manufacturing the same.

2. Description of Related Art

A flat panel display (FPD) device, such as an organic light-emitting display device or a liquid crystal display (LCD) device, is manufactured on a substrate on which a pattern is formed to include a thin film transistor (TFT), a capacitor, and a wiring for connection thereof. Generally, in the case of a substrate on which the FPD device is to be manufactured, in order to form a micro-structure pattern including a TFT, the micro-structure pattern is transferred onto the substrate by using a mask on which the micro-structure pattern is drawn.

However, to transfer the micro-structure pattern by using the mask, a mask including a desired pattern needs to be prepared. Thus as the number of processes using the mask increases, manufacturing cost for preparing the mask increases. Furthermore, since the above-described complicated processes should be undergone, a process of manufacturing the FPD device may become more intricate and manufacturing time may be increased, thereby also raising the manufacturing cost.

SUMMARY

One or more aspects of embodiments of the present invention provide an organic light-emitting display device in which a process of manufacturing the organic light-emitting display device is simplified, and in which damage to a pixel electrode and a pad electrode is reduced or minimized, and a method of manufacturing the same.

According to an embodiment of the present invention, there is provided an organic light-emitting display device including a thin film transistor (TFT) including an active layer, a gate electrode including a first electrode and a second electrode, a source electrode, and a drain electrode, a photoresist layer on the source electrode and the drain electrode, a pixel electrode electrically coupled to the TFT, including a same material as the first electrode, and at a same layer as the first electrode, a pixel defining layer having a hole exposing the pixel electrode, the pixel defining layer covering the photoresist layer, an intermediate layer on the pixel electrode and including a light-emitting layer, and an opposite electrode covering the intermediate layer and facing the pixel electrode.

The organic light-emitting display device may further include a capacitor including a lower electrode at a same layer as the active layer and including a semiconductor material doped with an impurity, and an upper electrode including the same material as the first electrode and on the same layer as the first electrode.

The photoresist layer may include an impurity that is the same as the impurity in the lower electrode.

The organic light-emitting display device may further include a pad electrode including the same material as the first electrode and at the same layer as the first electrode, wherein the pad electrode is electrically coupled to a driver integrated circuit for supplying a current for driving the organic light-emitting display device.

The first electrode and the pixel electrode may include at least one material selected from the group consisting of indium tin oxide (ITO), indium zinc oxide (IZO), zinc oxide (ZnO), indium oxide ($In_2O_3$), and combinations thereof.

The second electrode may include at least one material selected from the group consisting of silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), molybdenum (Mo), titanium (Ti), tungsten (W), molybdenum tungsten (MoW), aluminum/copper (Al/Cu), and combinations thereof.

The pixel electrode may be electrically coupled to either the source electrode or the drain electrode.

The organic light-emitting display device may further include a wiring electrically coupled to either the source electrode or the drain electrode, including the same material as the source electrode or the drain electrode, and at the same layer as the source electrode or the drain electrode, wherein the photoresist layer is at the wiring.

According to another embodiment of the present invention, there is provided a method of manufacturing an organic light-emitting display device, the method including processing a first mask for forming an active layer of a thin film transistor (TFT) and for forming a lower electrode of a capacitor including a semiconductor material on a substrate, processing a second mask for forming a first electrode pattern for forming a gate electrode of the TFT and a pixel electrode, and forming a second electrode pattern for forming an upper electrode of the capacitor on the active layer and the lower electrode, processing a third mask for forming an interlayer insulating layer having holes exposing both edges of the active layer, exposing the first electrode pattern, and exposing the second electrode pattern, processing a metal layer on an entire surface of the interlayer insulating layer, processing a fourth mask for forming a photoresist layer in an area corresponding to a source electrode and a drain electrode to pattern the metal layer into a source electrode and a drain electrode, forming the source electrode and the drain electrode coupled to respective edges of the active layer, forming the pixel electrode, and forming the upper electrode by patterning the metal layer through the photoresist layer, doping the lower electrode located below the upper electrode with an impurity, processing a fifth mask for forming a pixel-defining layer to expose the pixel electrode and to cover the photoresist layer, and forming an intermediate layer including a light-emitting layer on the pixel electrode and forming an opposite electrode facing the pixel electrode to cover the intermediate layer.

The method may further include forming a source area and a drain area by doping the active layer with an impurity, wherein the active layer includes the semiconductor material.

The processing the second mask may include sequentially forming a first insulating layer, a first conductive layer, and a second conductive layer on the active layer and the lower electrode, and forming the gate electrode for using the first conductive layer as a first electrode and for using the second conductive layer as a second electrode by patterning the first and second conductive layers.

The first conductive layer may include at least one material selected from the group consisting of ITO, IZO, ZnO, $In_2O_3$, and combinations thereof.

The second conductive layer may include at least one material selected from the group consisting of Ag, Mg, Al, Pt, Pd, Au, Ni, Nd, Ir, Cr, Li, Ca, Mo, Ti, W, MoW, Cu, and combinations thereof.

The forming the pixel electrode and the upper electrode may include forming the pixel electrode for using the first conductive layer as an electrode by removing the second conductive layer constituting the first electrode pattern, and forming the upper electrode for using the first conductive layer as an electrode by removing the second conductive layer constituting the second electrode pattern.

The processing the second mask may include sequentially forming a first insulating layer, a first conductive layer, and a second conductive layer on the active layer and the lower electrode, and forming a third electrode pattern for forming a pad electrode by patterning the first and second conductive layers.

The processing the third mask may include forming a second insulating layer on the gate electrode and the third electrode pattern, and forming the interlayer insulating layer having a hole exposing the third electrode pattern.

The method may further include forming the pad electrode for using the first conductive layer as an electrode by removing the second conductive layer corresponding to the third electrode pattern.

The processing the third mask may include forming a second insulating layer on the gate electrode, the first electrode pattern, and the second electrode pattern, and forming the interlayer insulating layer having holes exposing both edges of the active layer, exposing the first electrode pattern, and exposing the second electrode by patterning the second insulating layer.

The doping the lower electrode with an impurity may include doping the photoresist layer with the impurity.

The processing the fifth mask may include forming a third insulating layer on substantially an entire surface of the substrate, and forming the pixel-defining layer by patterning the third insulating layer.

The method may further include forming a wiring electrically coupled to either of the source electrode or the drain electrode with the forming the source electrode and the drain electrode, wherein the photoresist layer is also formed at the wiring.

BRIEF DESCRIPTION OF THE DRAWINGS

The above and other features and aspects of embodiments of the present invention will become more apparent by describing in detail exemplary embodiments of the present invention with reference to the attached drawings in which:

FIGS. 3 through 14 are schematic cross-sectional views illustrating a method of manufacturing the organic light-emitting display device of the embodiment shown in FIG. 2, according to an embodiment of the present invention.

DETAILED DESCRIPTION

Figure 1:
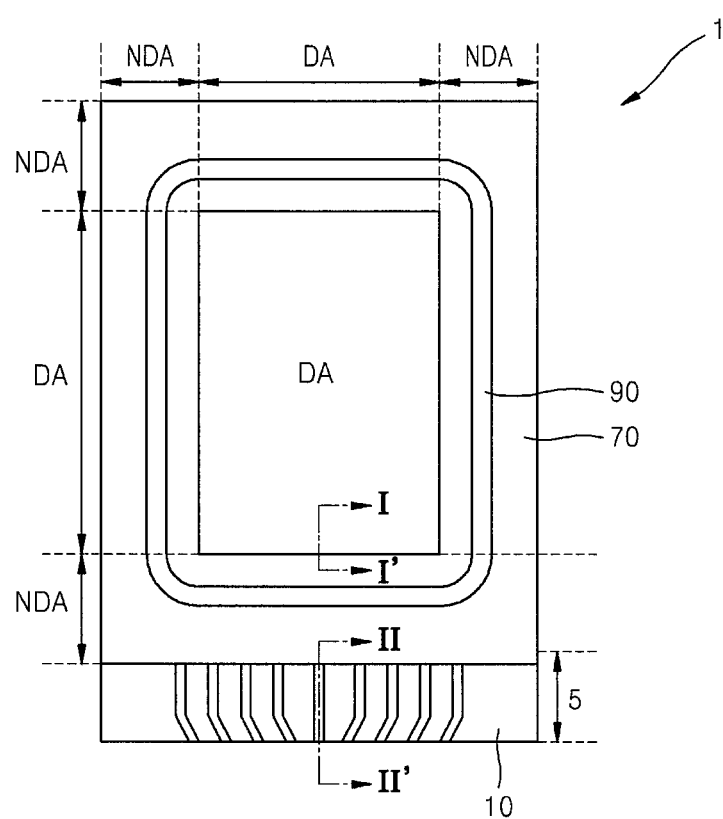
FIG. 1 is a schematic plan view of a structure of an organic light-emitting display device according to an embodiment of the present invention.

As the present invention allows for various changes and numerous embodiments, exemplary embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of embodiments of the present invention, certain detailed explanations of related art are omitted when it is deemed that they may unnecessarily obscure the essence of embodiments of the present invention.

While terms such as "first," "second," etc., may be used to describe various components, such components are not intended to be limited to the above terms. The above terms are used only to distinguish one component from another.

The terms used in the present specification are merely used to describe exemplary embodiments, and are not intended to limit the present invention. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Hereinafter, embodiments of the present invention will be described in detail with reference to the attached drawings.

FIG. 1 is a schematic plan view of a structure of an organic light-emitting display device 1 according to an embodiment of the present invention.

Referring to FIG. 1, the organic light-emitting display device 1 includes a first substrate 10 including a plurality of light-emitting pixels and a second substrate 70 bonded to the first substrate 10 by sealing.

A thin film transistor (TFT), an organic light-emitting diode (OLED) EL, and a capacitor Cst may be formed on the first substrate 10. Furthermore, the first substrate 10 may be a low-temperature poly silicon (LIPS) substrate made of crystalline silicon, glass, or plastic.

The second substrate 70 may be an encapsulation substrate, which is located on the first substrate 10, to keep the TFT and the light-emitting pixels included on the first substrate 10 away from external moisture and air. The second substrate 70 faces the first substrate 10. The first substrate 10 and the second substrate 70 are bonded using a sealing member 90 along edges of the first substrate 10 and the second substrate 70. The second substrate 70 may be, for example, a glass substrate, a plastic substrate, or a stainless steel (SUS) substrate.

The first substrate 10 includes a light-emitting area DA and a non-light-emitting area NDA outside the light-emitting area DA. According to an embodiment of the present invention, the sealing member 90 is located in the non-light-emitting area NDA, which is outside the light-emitting area DA, thus bonding the first substrate 10 and the second substrate 70.

As stated above, the OLED EL, the TFT for driving the OLED EL, and a wiring for electrically coupling the same are formed on the light-emitting area DA on the first substrate 10. In addition, the non-light-emitting area NDA may include a pad area 5 in which a pad electrode extended from the wiring in the light-emitting area DA is located.

Figure 2:
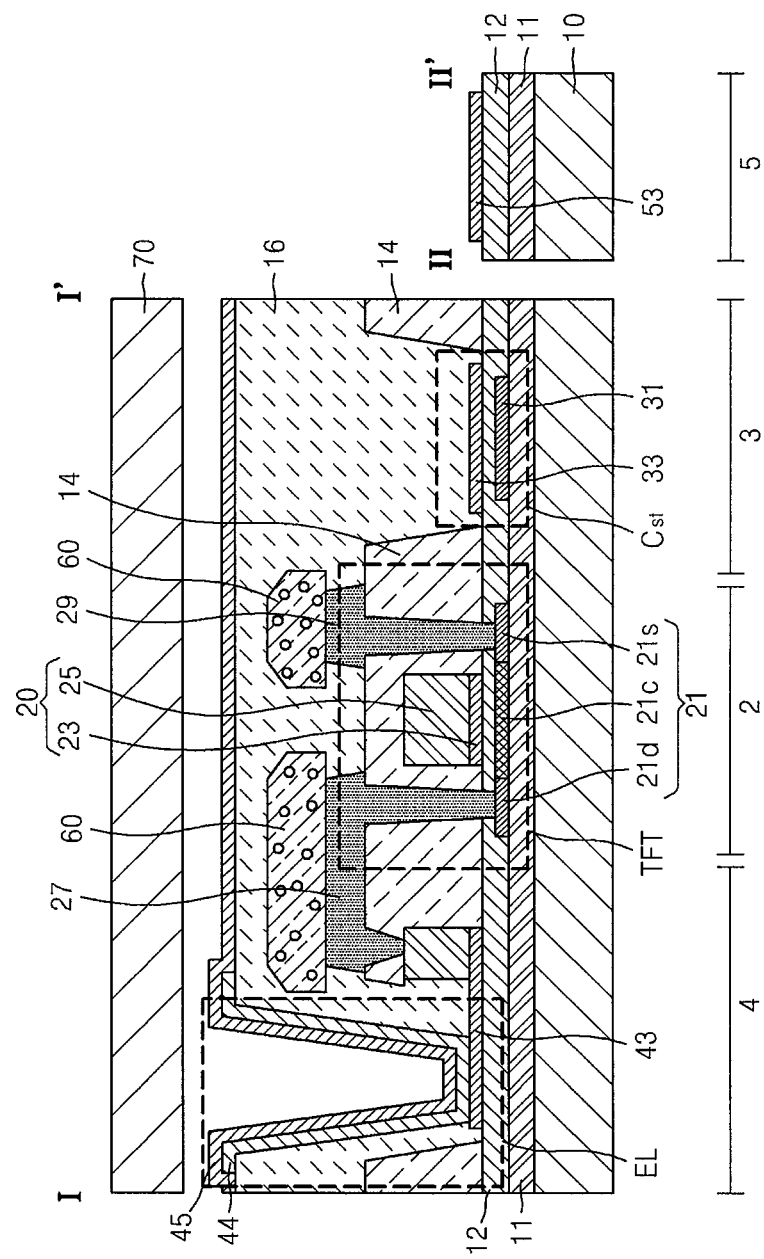
FIG. 2 is a cross-sectional view of the organic light-emitting display device of the embodiment shown in FIG. 1 taken along the lines I-I' and II-II' of FIG. 1.

FIG. 2 is a cross-sectional view of the organic light-emitting display device 1 of the embodiment shown in FIG. 1 taken along the lines I-I' and II-II' of FIG. 1.

Referring to FIG. 2, the organic light-emitting display device 1 of the present embodiment includes a transistor area 2, a storage area 3, a light-emitting area 4, and a pad area 5.

The transistor area 2 includes the TFT as a driving element. The TFT includes an active layer 21, a gate electrode 20, and source/drain electrodes 29 and 27. The gate electrode 20 includes a first electrode 23 and a second electrode 25 on the first electrode 23. The first electrode 23 may be formed of a transparent conductive material. A first insulating layer 12, which is a gate insulating layer, is interposed between the gate electrode 20 and the active layer 21 to insulate the gate electrode 20 from the active layer 21. In addition, source/drain areas 21s and 21d doped with a high-concentration of impurity are each formed at a respective edge of the active layer 21. The source/drain areas 21s and 21d are electrically coupled to the source/drain electrodes 29 and 27, respectively.

According to an embodiment of the present invention, a photoresist (PR) layer 60 is formed on the source/drain electrodes 29 and 27. The PR layer 60 is used for patterning the source/drain electrode 29/27. Accordingly, the PR layer 60 may be in a similar pattern as that of the source/drain electrode 29/27. The PR layer 60 is described more in detail below by referring to FIGS. 3 through 14, which illustrate a method of manufacturing the organic light-emitting display device 1 of the embodiment shown in FIG. 1, according to an embodiment of the present invention.

The storage area 3 includes the capacitor Cst. The capacitor Cst includes a lower electrode 31 and an upper electrode 33 with the first insulating layer 12 interposed therebetween. The lower electrode 31 may be formed on the same layer as the active layer 21 of the TFT. The lower electrode 31 of the present embodiment is formed of a semiconductor material and is doped with an impurity so that electrical conductivity of the organic light-emitting display device 1 is improved. The upper electrode 33 of the capacitor Cst may be formed of the same material as, and on the same layer as, the first electrode 23 of the gate electrode 20 of the TFT, a pixel electrode 43 of the OLED EL, and a pad electrode 53.

The light-emitting area 4 includes the OLED EL. The OLED EL includes the pixel electrode 43 electrically coupled to one of the source/drain electrodes 29 and 27 of the TFT, an opposite electrode 45 facing the pixel electrode 43, and an intermediate layer 44 interposed between the pixel electrode 43 and the opposite electrode 45. The pixel electrode 43 is formed of a transparent conductive material. The pixel electrode 43 may be formed of the same material as, and on the same layer as, the first electrode 23 of the TFT.

The pad area 5 includes the pad electrode 53. The pad electrode 53 may be formed of the same material as, and on the same layer as, the first electrode 23 of the TFT, the upper electrode 33 of the capacitor Cst, and the pixel electrode 43 of the OLED EL. The pad electrode 53 of the present embodiment is electrically coupled to a driver integrated circuit (IC) (not illustrated), which supplies a current for driving the organic light-emitting display device 1. Accordingly, the pad electrode 53 receives a current from the driver IC and transmits the current to the light-emitting area DA of FIG. 1.

FIGS. 3 through 14 are schematic cross-sectional views illustrating a method of manufacturing the organic light-emitting display device 1 of the embodiment shown in FIG. 2, according to an embodiment of the present invention. Hereinafter, the method of manufacturing the organic light-emitting display device 1 illustrated in FIG. 2 will be explained.

Figure 3:
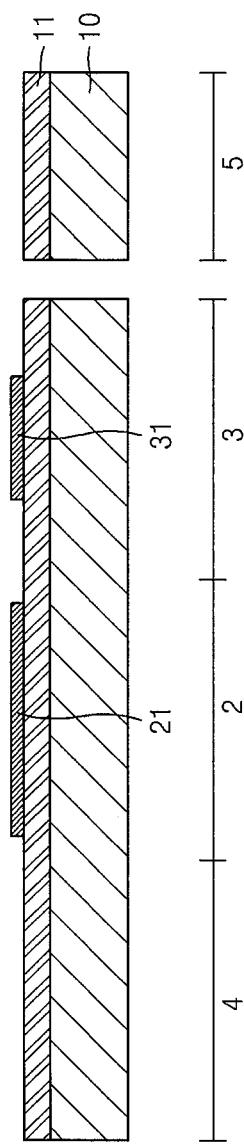

As illustrated in FIG. 3, an auxiliary layer 11 is formed on the substrate 10. In the present embodiment, the substrate 10 may be formed of transparent glass having silicon dioxide (SiO2) as a main component. However, the substrate 10 is not limited thereto, and may be formed of various materials, such as transparent plastic, metal, and the like.

The auxiliary layer 11, such as a barrier layer, a blocking layer, and/or a buffer layer, may be included on the substrate 100 to prevent spread of impurity ions, to prevent inflow of moisture or external air, and to planarize an upper surface of the substrate 100. The auxiliary layer 11 may be formed of, for example, $SiO_2$ and/or silicon nitride ($SiN_x$) by using various deposition methods, such as plasma-enhanced chemical vapor deposition (PECVD), atmospheric pressure chemical vapor deposition (APCVD), low pressure chemical vapor deposition (LPCVD), and the like.

According to the present embodiment, the active layer 21 of the TFT and the lower electrode 31 of the capacitor Cst are formed on the auxiliary layer 11. In the present embodiment, an amorphous silicon layer (not illustrated) is deposited and crystallized on the auxiliary layer 11, so as to form a polycrystalline silicon layer (not illustrated). Amorphous silicon may be crystallized by using various methods, such as rapid thermal annealing (RTA), solid phase crystallization (SPC), excimer laser annealing (ELA), metal-induced crystallization (MIC), metal-induced lateral crystallization (MILC), sequential lateral solidification (SLS), and the like. As such, the polycrystalline silicon layer is patterned into the active layer 21 of the TFT and the lower electrode 31 of the capacitor Cst by performing a mask process using a first mask (not illustrated).

In the present embodiment, the active layer 21 of the TFT and the lower electrode 31 of the capacitor Cst are formed separate from each other. However, the active layer 21 of the TFT and the lower electrode 31 of the capacitor Cst may be formed as one body.

Figure 4:
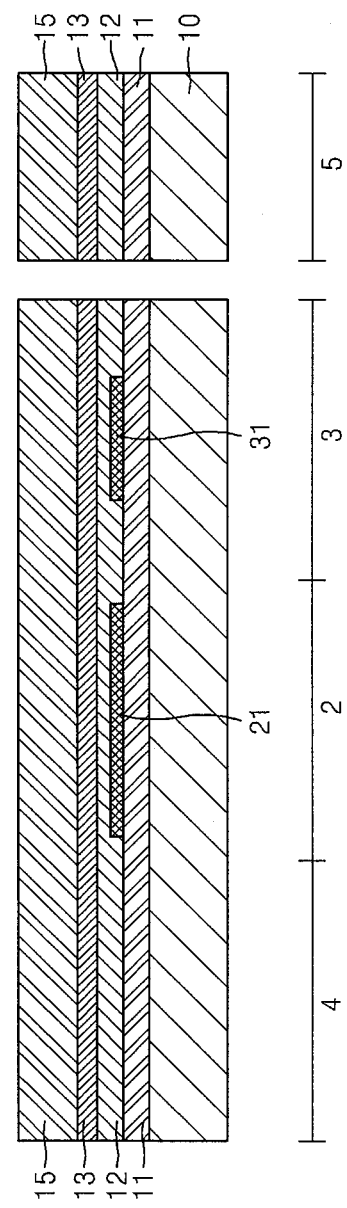

Then, as illustrated in FIG. 4, the first insulating layer 12, a first conductive layer 13, and a second conductive layer 15 are sequentially formed on the entire surface of the substrate 10 having the active layer 21 of the TFT and the lower electrode 31 of the capacitor Cst formed thereon.

The first insulating layer 12 may be formed by depositing an inorganic insulating layer such as, for example, $SiN_x$ or $SiO_x$ by using PECVD, APCVD, or LPCVD. The first insulating layer 12 is interposed between the active layer 21 and the gate electrode 20 of the TFT and functions as a gate insulating layer of the TFT (for example, see FIGS. 2 and 5). The first insulating layer 12 is also interposed between the upper electrode 33 and the lower electrode 31 of the capacitor Cst and functions as a dielectric layer of the capacitor Cst (for example, see FIGS. 2 and 5).

According to the present embodiment, the first conductive layer 13 may include at least one material selected from the group consisting of transparent materials, such as indium tin oxide (ITO), indium zinc oxide (IZO), zinc oxide (ZnO), and indium oxide ($In_2O_3$). Later, the first conductive layer 13 may be patterned into one or more of the pixel electrode 43, the first gate electrode 23, the upper electrode 33 of the capacitor Cst, and the pad electrode 53 (for example, see FIGS. 2 and 5).

According to the present embodiment, the second conductive layer 15 may include at least one material selected from the group consisting of silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), molybdenum (Mo), titanium (Ti), tungsten (W), molybdenum tungsten (MoW), and aluminum/copper (Al/Cu). Furthermore, the second conductive layer 15 may be formed of a three-layered structure (e.g., Mo—Al—Mo). Later, the second conductive layer 15 may be patterned into the second gate electrode 25 (see FIGS. 2 and 5).

Then, as illustrated in FIG. 5, the gate electrode 20, a first electrode pattern 40, a second electrode pattern 30, and a third electrode pattern 50 are respectively formed on the substrate 10.

According to the present embodiment, the first conductive layer 13 and the second conductive layer 15, which are stacked sequentially on the entire surface of the substrate 10, are patterned by performing a mask process using a second mask (not illustrated).

In the transistor area 2, the gate electrode 20 is formed on the active layer 21. The gate electrode 20 includes the first gate electrode 23, which is formed from a part of the first conductive layer 13, and the second gate electrode 25, which is formed from a part of the second conductive layer 15.

The gate electrode 20 is formed at a location which corresponds to a center of the active layer 21. The active layer 21 is doped with an n-type or p-type impurity by using the gate electrode 20 as a self-align mask. By doing so, source/drain areas 21s and 21d, and a channel area 21c located between the source/drain areas 21s and 21d, are formed on the active layer 21 with the source/drain areas 21s and 21d being formed at edges of the active layer, which correspond to respective sides of the gate electrode 20. According to the present embodiment, the impurity may be boron (B) ions or phosphorous (P) ions.

In the storage area 3, the second electrode pattern 30, which is to form the upper electrode 33 of the capacitor Cst below (e.g., below the second electrode pattern 30), is formed on the lower electrode 31 of the capacitor Cst. In the light-emitting area 4, the first electrode pattern 40, which is for forming the pixel electrode 43 later, is formed. Additionally, in the pad area 5, the third electrode pattern 50, which is for forming the pad electrode 53 later, is formed.

Then, as illustrated in FIG. 6, a second insulating layer 14 is deposited on the entire surface of the substrate 10 having the gate electrode 20 formed thereon.

According to the present embodiment, the second insulating layer 14 is formed by employing a spin-coating method using at least one material selected from the group consisting of organic insulating materials, such as polyimide, polyamide, acryl resin, and benzo-cyclo-butene (BCB), phenolic resin. The second insulating layer 14 is formed to have a sufficient thickness, for example, to be thicker than the first insulating layer 12, thus functioning as an interlayer insulating layer between the gate electrode 20 and the source/drain electrode 29/27 of the TFT (see FIGS. 2 and 9). The second insulating layer 14 may be formed by using an inorganic insulating material, such as one similar to the first insulating layer 12, as well as the organic insulating material described above. The second insulating layer 14 may also be formed by alternating the organic insulating material and the inorganic insulating material.

Figure 7:
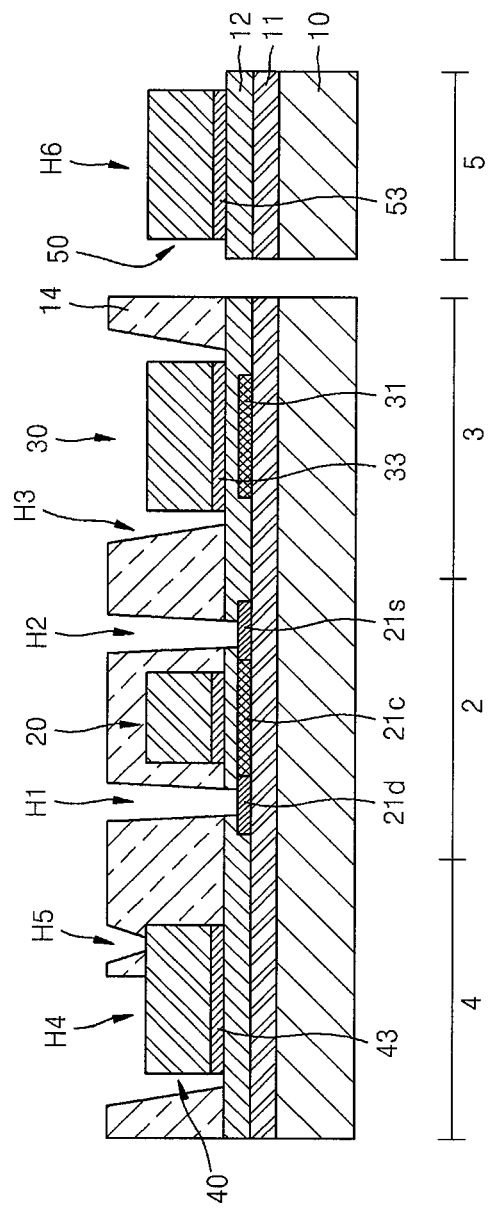

Then, as illustrated in FIG. 7, the second insulating layer 14 is patterned to form the interlayer insulating layer 14 having first to sixth holes H1, H2, H3, H4, H5, and H6 collectively exposing parts of the first, second, third electrode patterns 30, 40, and 50 and the source/drain areas 21s/21d of the active layer 21.

According to the present embodiment, the second insulating layer 14 is patterned by performing a mask process using a third mask (not illustrated), so as to form the holes H1, H2, H3, H4, H5, and H6. The first and second holes H1 and H2 expose parts of the source/drain areas 21s and 21d, respectively. The third hole H3 exposes at least a part of the second conductive layer 15 constituting an upper part of the second electrode pattern 30. The fourth and fifth holes H4 and H5 expose at least a part of the second conductive layer 15 constituting an upper part of the first electrode pattern 40. The sixth hole H6 exposes at least a part of the second conductive layer 15 that constitutes an upper part of the third electrode pattern 50. As illustrated in FIG. 7, the third and fifth holes H3 and H5 may be formed to entirely expose the second and third electrode patterns 30 and 50, respectively, although the present invention is not limited thereto.

Figure 8:
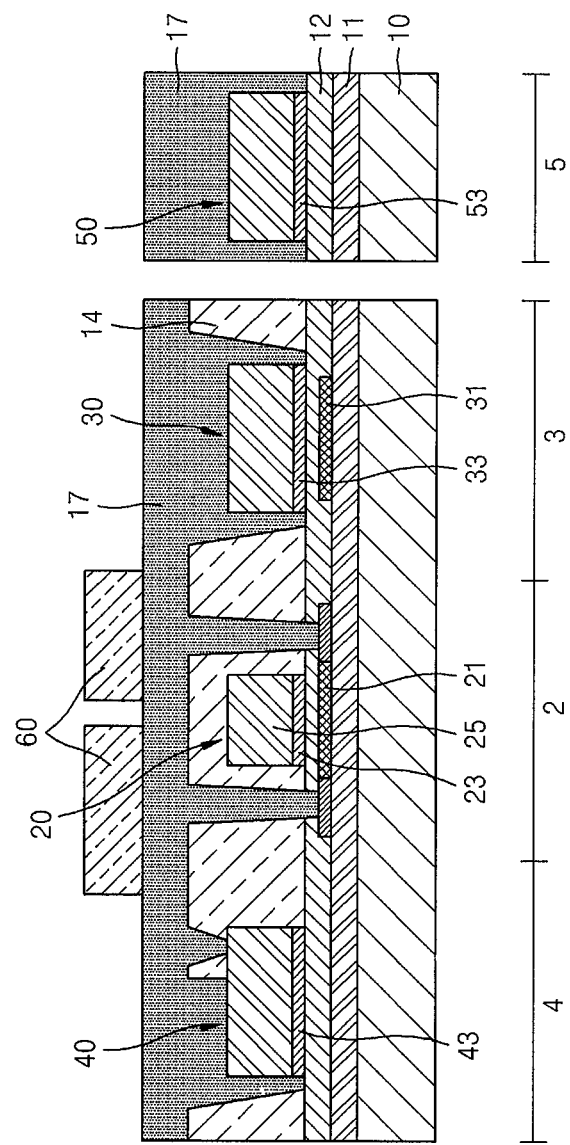

As illustrated in FIG. 8, a third conductive layer 17 is deposited on the entire surface of the substrate 10 so as to cover the interlayer insulating layer 14.

The third conductive layer 17 may be formed by using at least one material selected from among the same conductive materials as the first and second conductive layers 13 and 15. However, the third conductive layer 17 is not limited thereto, and may be formed of various conductive materials. In the present embodiment, the conductive materials are deposited with a thickness that is sufficient to fill the first to sixth holes H1, H2, H3, H4, H5, and H6.

As illustrated in FIG. 8, an entire surface of the third conductive layer 17 is evenly coated with a PR material. The PR material is a photosensitive polymer and includes a material that reacts to light. The PR material may include, for example, a solvent, a hydrocarbon polymer, and a photoactive compound (PAC). The PR material is largely classified into two types: a negative type and a positive type. In the case of the negative type, a portion exposed to light becomes insoluble and an unexposed portion is developed. In the case of the positive type, a portion exposed to light is dissolved. The PR material is coated, and then is exposed by employing an exposure tool, such as a stepper, according to a mask process using a fourth mask (not illustrated). Then, in the case of a positive PR, an exposed PR is developed so as to form a PR layer 60 having a pattern obtained according to an area that does not correspond to a hole of the fourth mask. In the case of a negative PR, an exposed PR is developed so as to form a PR layer 60 having a pattern obtained according to a hole of the fourth mask. As the fourth mask functions to at least form the source/drain electrode 29/27, the PR layer 60 remains only in an area at least in which the source/drain electrode 29/27 is to be formed thereon.

Figure 9:
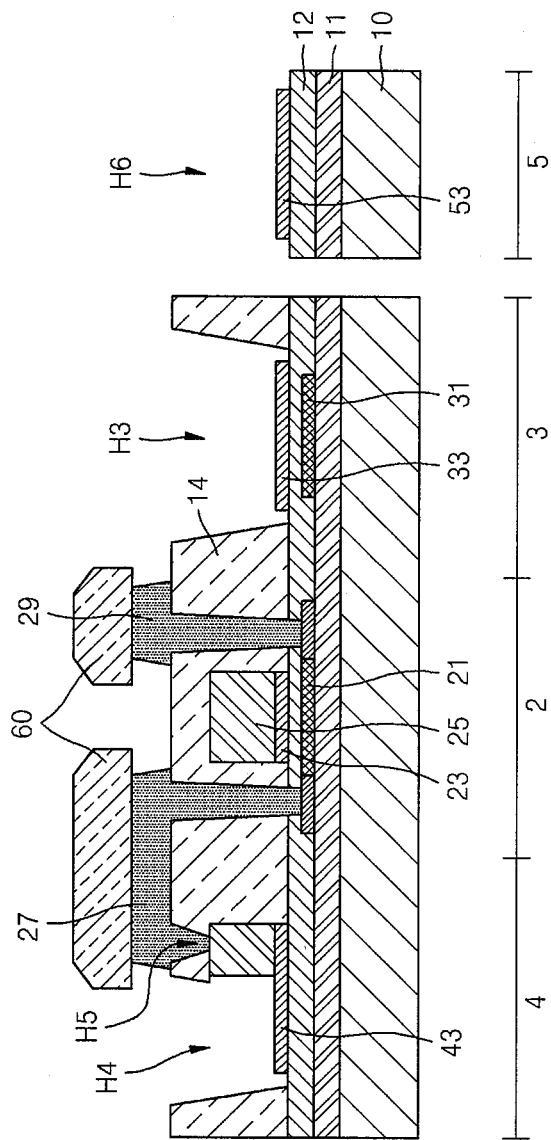

Then, as illustrated in FIG. 9, the source/drain electrodes 29 and 27, the pixel electrode 43, the upper electrode 33 of the capacitor Cst, and the pad electrode 53 are formed by etching the third conductive layer 17 of FIG. 8 by using the remaining PR layer 60 as a mask.

One of the source/drain electrodes 29 and 27 is formed to couple to the pixel electrode 43 through the fifth hole H5 at the edge of an upper part of the second conductive layer 15 on the electrode pattern 40 of FIG. 8, in which the pixel electrode 43 is to be formed.

While forming the source/drain electrode 29/27, the pixel electrode 43 and the upper electrode 33 of the capacitor Cst may be formed. However, the present invention is not limited thereto, and the pixel electrode 43 and the upper electrode 33 of the capacitor Cst may be respectively formed by an additional etching after the source/drain electrode 29/27 is formed. In the present embodiment, with regard to the first electrode pattern 40 of FIG. 8, the pixel electrode 43 is formed by removing an upper part of the second conductive layer 15 that is exposed through the fourth hole H4. With regard to the second electrode pattern 30 of FIG. 8, the upper electrode 33 of the capacitor Cst is formed by removing the upper part of the second conductive layer 15 that is exposed through the third hole H3. In addition, with regard to the third electrode pattern 50 of FIG. 8, the pad electrode 53 is formed by removing the upper part of the second conductive layer 15 that is exposed through the sixth hole H6. Accordingly, according to the present embodiment, the first gate electrode 23, the upper electrode 33 of the capacitor Cst, the pixel electrode 43, and the pad electrode 53 are formed of the same material and on the same layer.

Figure 10:
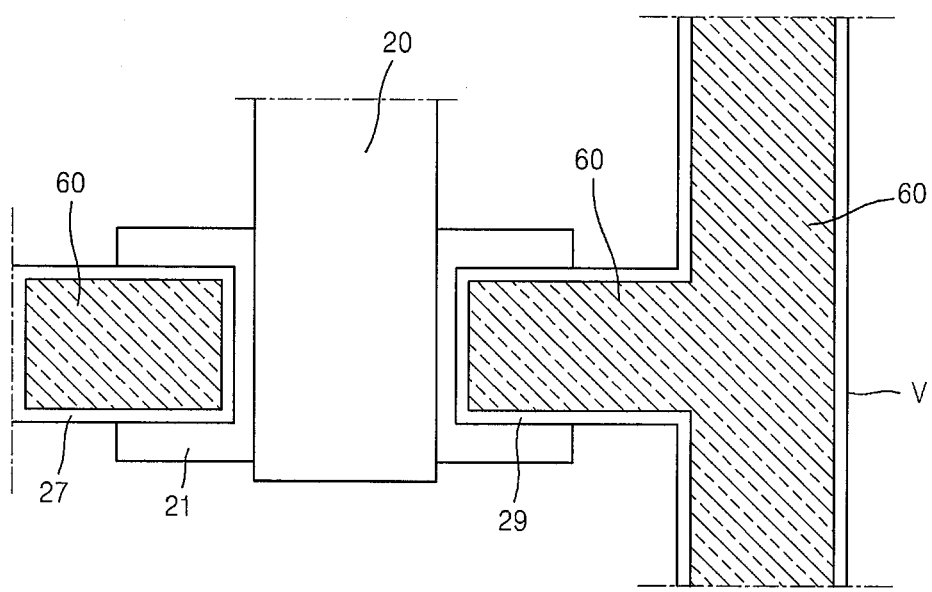

FIG. 10 is a schematic plan view separately illustrating the transistor area 2 of the present embodiment.

Referring to FIG. 10, either or both of the source/drain electrodes 29 and 27 may be electrically coupled to a wiring V. FIG. 10 illustrates the source electrode 29 coupled to the wiring V. However, the present invention is not limited to the illustration of FIG. 10. In the case of a switching transistor, a source electrode may be electrically coupled to a data wiring, and a drain electrode may be electrically coupled to a connection electrode for coupling with an upper or lower electrode of a capacitor. Such a wiring V may be formed simultaneously when the source/drain electrode 29/27 is formed by patterning the third conductive layer 17 of FIG. 8 using the fourth mask. Accordingly, the PR layer 60 may remain on the wiring V like in the source/drain electrode 29/27.

Figure 11:
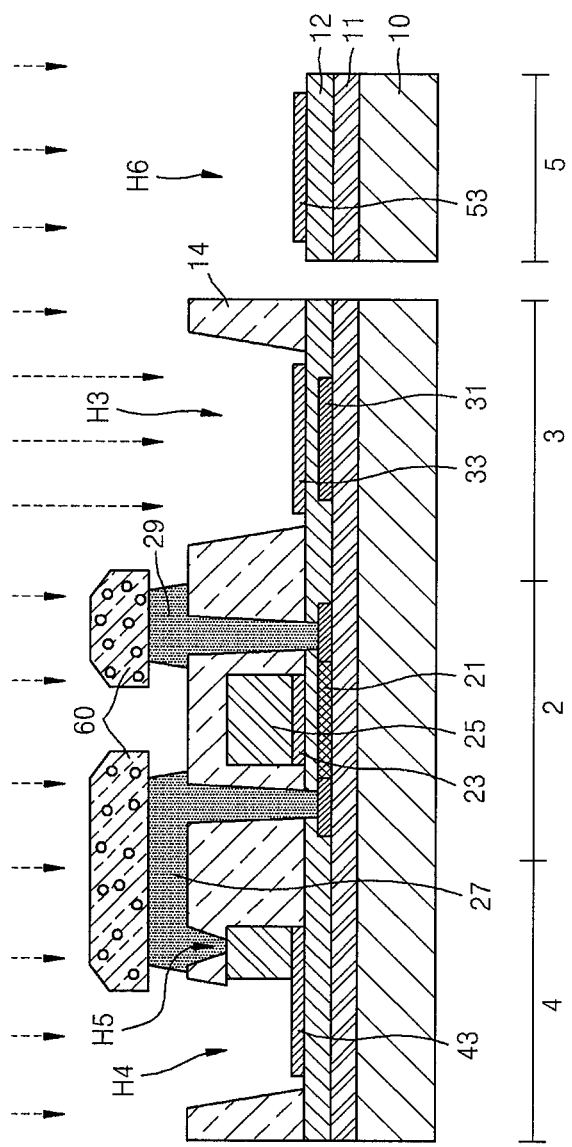

As illustrated in FIG. 11, the lower electrode 31 of the capacitor Cst is doped by injecting an n-type or p-type impurity.

The lower electrode 31 of the capacitor Cst may be doped by injecting an n-type or p-type impurity through the third hole H3. The impurity injected for doping may be the same as, or different from, the impurity used for doping of the active layer 21. For example, the impurity may be boron (B) ions or phosphorous (P) ions.

In the process performed prior to FIG. 11, it was difficult, if not impossible, to dope the lower electrode 31 of the capacitor Cst due to the second conductive layer 15 of FIG. 4 on the second electrode pattern 30 of FIG. 8. Accordingly, the second conductive layer 15 of FIG. 4 on the second electrode pattern 30 of FIG. 8 is etched concurrently, (e.g., simultaneously) when the source/drain electrode 29/27 is formed. Then, the lower electrode 31 of the capacitor Cst is doped when only the transparent upper electrode 33 of the capacitor Cst, which does not obstruct doping, remains. Referring to FIG. 11, the third hole H3 is formed large enough to completely expose the upper electrode 33 of the capacitor Cst, and the second conductive layer 15 of FIG. 4 of the second electrode pattern 30 of FIG. 8 is completely etched. Accordingly, the lower electrode 31 of the capacitor Cst may be completely doped, thereby improving an aperture ratio, increasing an electrostatic capacity, and improving a quality of signal transmission of a capacity wiring.

According to an embodiment of the present invention, after an etching process is performed by using the PR layer 60 as a mask, the PR layer 60 is not removed through ashing and stripping. An ashing and stripping process is also called a stripping process. The ashing and stripping process includes etching of a PR material, which is coated for forming a pattern in a photolithography process, and stripping a remaining PR material. For example, in the ashing process, the remaining PR layer 60 may be removed by employing an oxygen ($O_2$) plasma which uses $O_2$ gas. A PR material basically contains a hydrocarbon polymer. Therefore, as an oxygen atom quickly reacts with a PR material and generates a volatile carbon monoxide (CO), a carbon dioxide ($CO_2$), and water ($H_2O$), the oxygen atom may be easily removed. The stripping process is to remove the PR layer 60 by using a sulfuric acid ($H_2SO_4$) and a hydrogen peroxide ($H_2O_2$).

Doping of an impurity mainly targets the lower electrode 31 of the capacitor Cst. However, as the doping may be performed on a full scale, the impurity may be injected into the PR layer 60, resulting in doping of the PR layer 60. The impurity may cause secondary hardening of the PR layer 60. The secondary-hardened PR layer 60 may not be easily removed through ashing and stripping. Even if the remaining PR layer 60 is removed by using strong plasma treatment or chemical treatment, a serious damage may occur to the pixel electrode 43, the upper electrode 33 of the capacitor Cst, and the pad electrode 53, which are exposed through the holes H4, H3, and H6, respectively. The damaged pixel electrode 43 may deteriorate a quality of the OLED EL, and the damaged capacitor Cst and pad electrode 53 may deteriorate a quality of signal transmission. Therefore, according to an embodiment of the present invention, instead of removing the PR material 60, the PR layer 60 remains with a doped impurity, thus simplifying the process and preventing damage to other electrodes.

Figure 12:
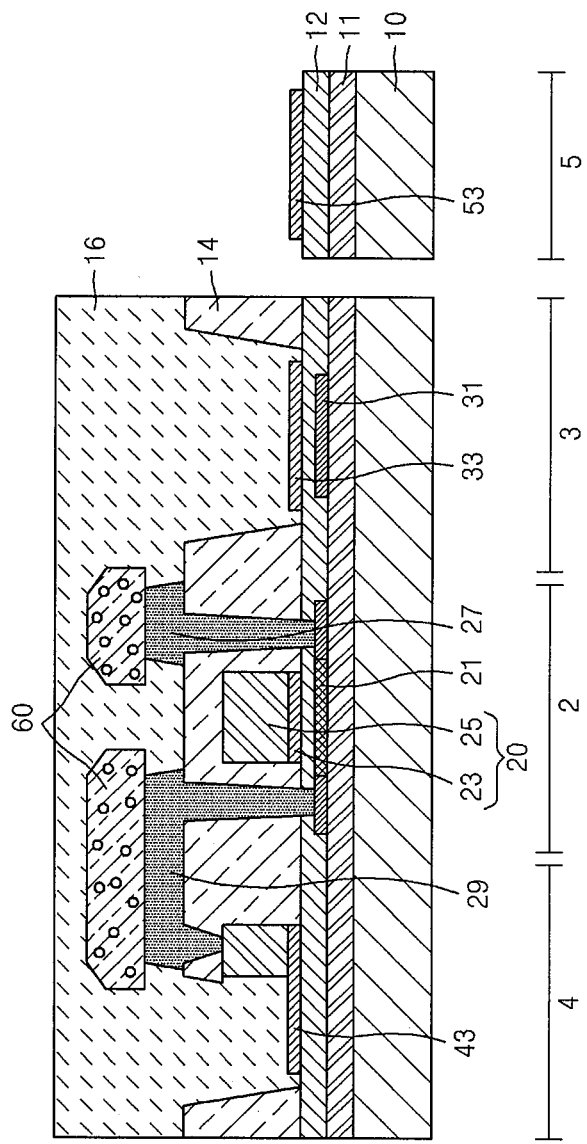

Then, as illustrated in FIG. 12, a third insulating layer 16 is formed on the substrate 10.

According to the present embodiment, the third insulating layer 16 is deposited with a sufficient thickness on an entire surface of the substrate 10 on which the pixel electrode 43, the source/drain electrode 29/27, the upper electrode 33 of the capacitor Cst, and the pad electrode 53 are formed, and is deposited to cover the photoresist layer 60. The third insulating layer 16 may be formed by employing a spin coating method using at least one material selected from the group consisting of organic insulating materials such as polyimide, polyamide, acryl resin, benzo-cyclo-butene (BCB), and phenolic resin. The third insulating layer 16 may also be formed by using an inorganic insulating material selected from the group consisting of $SiO_2$, SiNx, $Al_2O_3$, CuOx, $Tb_4O_7$, $Y_2O_3$, $Nb_2O_5$, and $Pr_2O_3$, as well as the organic insulating material described above. Additionally, the third insulating layer 16 may also be formed in a structure of multiple layers in which the organic insulating material and the inorganic insulating material are alternately used.

The third insulating layer 16 may be deposited or not deposited on the pad area 5, according to a choice.

Figure 13:
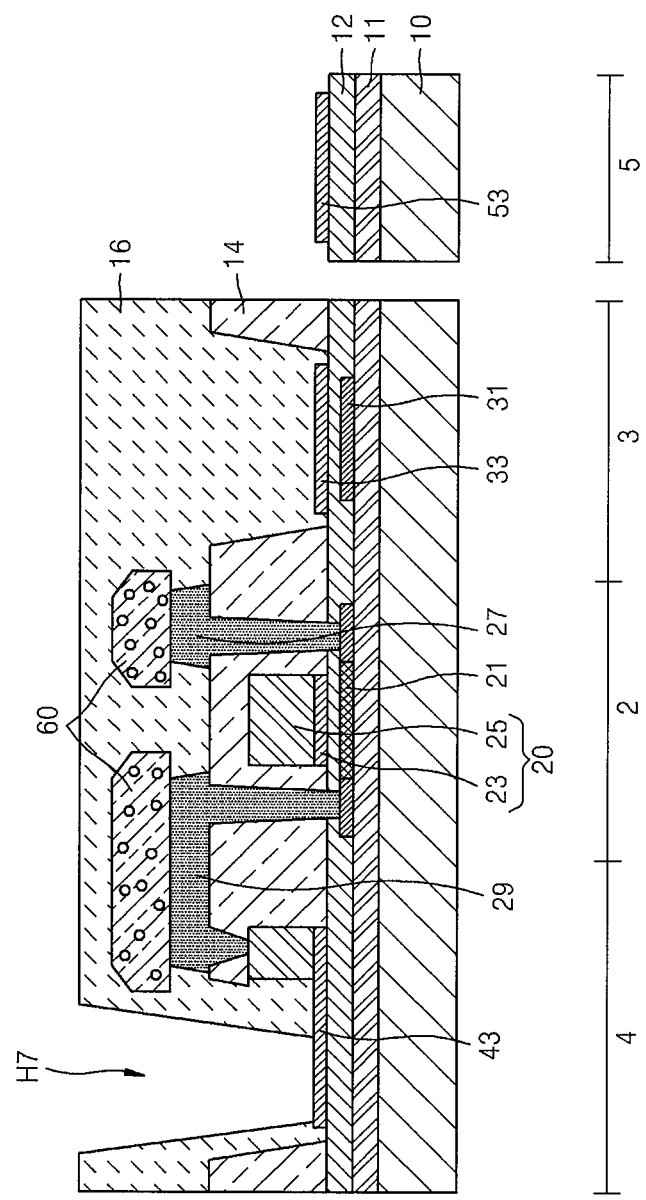

Then, as illustrated in FIG. 13, the third insulating layer 16 is patterned to form a pixel-defining layer (PDL) 16. The pixel-defining layer (PDL) 16 is patterned by employing a mask process using a fifth mask (not illustrated) to form a hole H7 exposing a center area of the pixel electrode 43, thereby defining a pixel.

Figure 14:
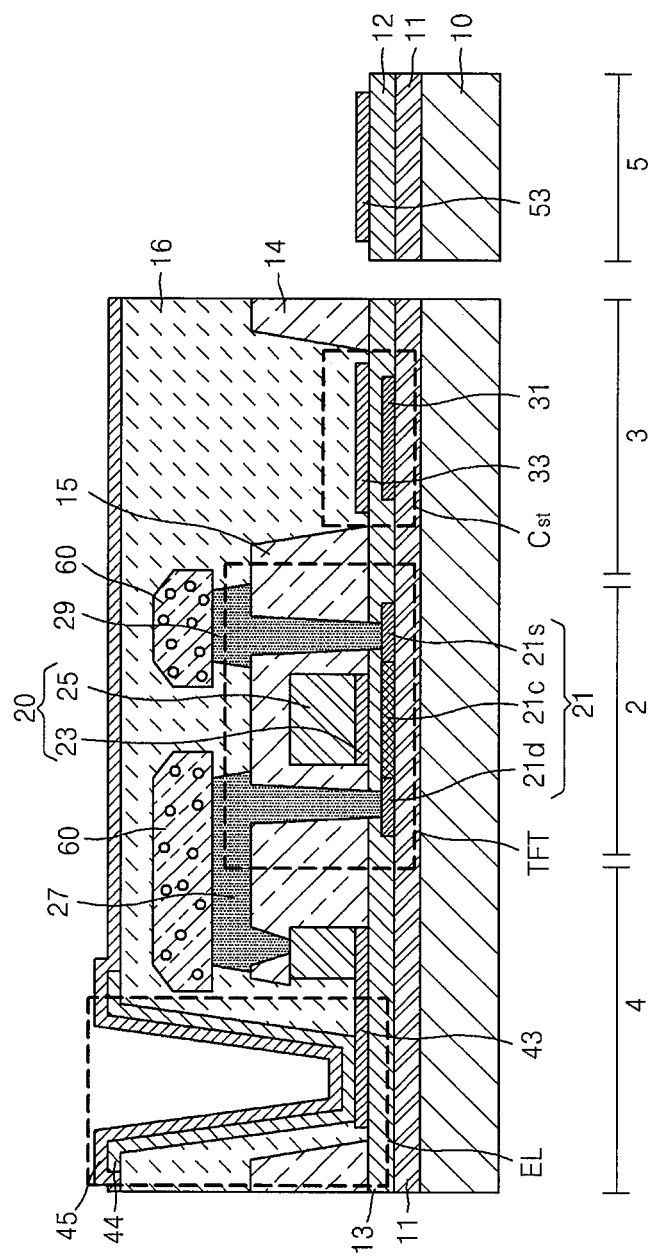

Lastly, as illustrated in FIG. 14, the intermediate layer 44 and the opposite electrode 45 including a light-emitting layer are formed in the hole H7 exposing the pixel electrode 43.

The intermediate layer 44 may be formed by stacking one or more layers from among functional layers such as an emissive layer (EML), a hole transport layer (HTL), a hole injection layer (HIL), an electron transport layer (ETL), and/or an electron injection layer (EIL) to form a structure of single or multiple layers.

According to the present embodiment, the intermediate layer 44 may include a low-molecular weight organic material or a polymer organic material. When the intermediate layer 44 is formed of a low-molecular weight organic material, the intermediate layer 44 may be formed by stacking the HTL and the HIL in a direction from the EML to the pixel electrode 43, and stacking the ETL and the EIL in a direction from the EML to the opposite electrode 45. Besides, other layers may be stacked as desired. Other organic materials such as copper phthalocyanine (CuPc), N,N'-Di(naphthalene-1-yl)-N,N'-diphenyl-benzidine (NPB), and tris-8-hydroxyquinoline aluminum(Alq3) may be used.

When the intermediate layer 44 is formed of a polymer organic material, the intermediate layer 44 may include only the ETL in a direction from the EML to the pixel electrode 43. The ETL may be formed on the pixel electrode 43 by employing an ink-jet printing method or a spin-coating method using poly-(2,4)-ethylene-dihydroxy thiophene (PEDOT) or polyaniline (PANI). Other organic materials including polymer organic materials such as Poly-Phenylenevinylene (PPV) and Polyfluorene may be used. A color pattern may be formed by using a conventional method such as an ink-jet printing method, a spin coating method, a laser-based thermal transfer method, or the like.

The opposite electrode 45 may be deposited on the entire surface of the substrate 10 and may be formed as a common electrode. In the case of the organic light-emitting display device 1 according to the present embodiment, the pixel electrode 43 may be used as an anode electrode and the opposite electrode 45 may be used as a cathode electrode, or vice versa.

When the organic light-emitting display device 1 is a bottom-emission type display device that displays an image in a direction towards the substrate 10, the pixel electrode 43 may be a transparent electrode, and the opposite electrode 45 may be a reflective electrode. The reflective electrode may be formed by thinly depositing metal having a low work function, for example, Ag, Mg, Al, Pt, Pd, Au, Ni, Nd, Ir, Cr, Li, Ca, LiF/Ca, LiF/Al, or a combination thereof.

The following Table 1 presents a comparison of a comparison group and an experimental group with regard to luminous efficiency. The comparison group includes the organic light-emitting display device 1 having the remaining PR layer 60 according to an embodiment of the present invention. The experimental group includes an organic light-emitting display device in which the PR layer 60 is removed. Particularly, Table 1 shows a luminous efficiency of a blue sub-pixel.

TABLE 1

| Luminous Efficiency | Comparison Group | Experimental Group |
|---|---|---|
| Cd/A (candela/ampere) | 5.7 | 5.5 |

As shown by the result in Table 1, the comparison group, which has the remaining PR layer 60, showed a higher luminous efficiency, which indicates that the organic light-emitting display device 1 according to the present embodiment may reduce or prevent damage to the pixel electrode 43, and thus, may improve the luminous efficiency of the organic light-emitting display device 1 by having the remaining PR layer 60.

During each mask process for forming the organic light-emitting display device 1 of embodiments of the present invention, a stacked layer may be removed by performing dry etching or wet etching.

In the present embodiment, the organic light-emitting display device 1 is described as an example. However, the present invention is not limited thereto, and embodiments of the present invention may be applied to other display devices, such as a liquid crystal display (LCD) device and the like.

Besides, the organic light-emitting display device 1 of embodiments of the present invention only illustrate one TFT and one capacitor for convenience of description. However, the present invention is not limited thereto, and the organic light-emitting display device 1 may include a plurality of TFTs and a plurality of capacitors as desired (e.g., unless the number of mask processes increases).

As described above, in an organic light-emitting display device and a method of manufacturing the organic light-emitting display device according to embodiments of the present invention, the method of manufacturing the organic light-emitting display device may be simplified and damage to a pixel electrode and a pad electrode may be reduced or minimized, thereby improving a reliability of the organic light-emitting display device.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. An organic light-emitting display device comprising:
   a thin film transistor (TFT) comprising:
      an active layer;
      a gate electrode comprising a first electrode and a second electrode;
      a source electrode; and
      a drain electrode;
   a photoresist layer on the source electrode and the drain electrode;
   a pixel electrode electrically coupled to the TFT, comprising a same material as the first electrode, and at a same layer as the first electrode;
   a pixel defining layer having a hole exposing the pixel electrode, the pixel defining layer covering the photoresist layer;
   an intermediate layer on the pixel electrode and comprising a light-emitting layer; and
   an opposite electrode covering the intermediate layer and facing the pixel electrode.

2. The organic light-emitting display device of claim 1, further comprising a capacitor comprising:
   a lower electrode at a same layer as the active layer and comprising a semiconductor material doped with an impurity; and
   an upper electrode comprising the same material as the first electrode and on the same layer as the first electrode.

3. The organic light-emitting display device of claim 2, wherein the photoresist layer comprises an impurity that is the same as the impurity in the lower electrode.

4. The organic light-emitting display device of claim 1, further comprising a pad electrode comprising the same material as the first electrode and at the same layer as the first electrode,
   wherein the pad electrode is electrically coupled to a driver integrated circuit for supplying a current for driving the organic light-emitting display device.

5. The organic light-emitting display device of claim 1, wherein the first electrode and the pixel electrode comprise at least one material selected from the group consisting of indium tin oxide (ITO), indium zinc oxide (IZO), zinc oxide (ZnO), indium oxide ($In_2O_3$), and combinations thereof.

6. The organic light-emitting display device of claim 1, wherein the second electrode comprises at least one material selected from the group consisting of silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), molybdenum (Mo), titanium (Ti), tungsten (W), molybdenum tungsten (MoW), aluminum/copper (Al/Cu), and combinations thereof.

7. The organic light-emitting display device of claim 1, wherein the pixel electrode is electrically coupled to either the source electrode or the drain electrode.

8. The organic light-emitting display device of claim 1, further comprising a wiring electrically coupled to either the source electrode or the drain electrode, comprising the same material as the source electrode or the drain electrode, and at the same layer as the source electrode or the drain electrode, wherein the photoresist layer is at the wiring.

9. A method of manufacturing an organic light-emitting display device, the method comprising:
- processing a first mask for forming an active layer of a thin film transistor (TFT) and for forming a lower electrode of a capacitor comprising a semiconductor material on a substrate;
- processing a second mask for forming a first electrode pattern for forming a gate electrode of the TFT and a pixel electrode, and forming a second electrode pattern for forming an upper electrode of the capacitor on the active layer and the lower electrode;
- processing a third mask for forming an interlayer insulating layer having holes exposing both edges of the active layer, exposing the first electrode pattern, and exposing the second electrode pattern;
- processing a metal layer on an entire surface of the interlayer insulating layer;
- processing a fourth mask for forming a photoresist layer in an area corresponding to a source electrode and a drain electrode to pattern the metal layer into the source electrode and the drain electrode;
- forming the source electrode and the drain electrode coupled to respective edges of the active layer, exposing the pixel electrode, and exposing the upper electrode by patterning the metal layer through the photoresist layer;
- doping the lower electrode located below the upper electrode with an impurity;
- processing a fifth mask for forming a pixel-defining layer to expose the pixel electrode and to cover the photoresist layer; and
- forming an intermediate layer comprising a light-emitting layer on the pixel electrode and forming an opposite electrode facing the pixel electrode to cover the intermediate layer.

10. The method of claim 9, further comprising forming a source area and a drain area by doping the active layer with an impurity, wherein the active layer comprises the semiconductor material.

11. The method of claim 9, wherein the processing the second mask comprises:
- sequentially forming a first insulating layer, a first conductive layer, and a second conductive layer on the active layer and the lower electrode; and
- forming the gate electrode for using the first conductive layer as a first electrode and for using the second conductive layer as a second electrode by patterning the first and second conductive layers.

12. The method of claim 11, wherein the first conductive layer comprises at least one material selected from the group consisting of ITO, IZO, ZnO, $In_2O_3$, and combinations thereof.

13. The method of claim 11, wherein the second conductive layer comprises at least one material selected from the group consisting of Ag, Mg, Al, Pt, Pd, Au, Ni, Nd, Ir, Cr, Li, Ca, Mo, Ti, W, MoW, Cu, and combinations thereof.

14. The method of claim 11, wherein the forming the pixel electrode and the upper electrode comprises:
- forming the pixel electrode for using the first conductive layer as an electrode by removing the second conductive layer constituting the first electrode pattern; and
- forming the upper electrode for using the first conductive layer as an electrode by removing the second conductive layer constituting the second electrode pattern.

15. The method of claim 9, wherein the processing the second mask comprises:
- sequentially forming a first insulating layer, a first conductive layer, and a second conductive layer on the active layer and the lower electrode; and
- forming a third electrode pattern for forming a pad electrode by patterning the first and second conductive layers.

16. The method of claim 15, wherein the processing the third mask comprises:
- forming a second insulating layer on the gate electrode and the third electrode pattern; and
- forming the interlayer insulating layer having a hole exposing the third electrode pattern.

17. The method of claim 15, further comprising forming the pad electrode for using the first conductive layer as an electrode by removing the second conductive layer corresponding to the third electrode pattern.

18. The method of claim 9, wherein the processing the third mask comprises:
- forming a second insulating layer on the gate electrode, the first electrode pattern, and the second electrode pattern; and
- forming the interlayer insulating layer having holes exposing both edges of the active layer, exposing the first electrode pattern, and exposing the second electrode pattern by patterning the second insulating layer.

19. The method of claim 9, wherein the doping the lower electrode with an impurity comprises doping the photoresist layer with the impurity.

20. The method of claim 9, wherein the processing the fifth mask comprises:
- forming a third insulating layer on substantially an entire surface of the substrate; and
- forming the pixel-defining layer by patterning the third insulating layer.

21. The method of claim 9, further comprising forming a wiring electrically coupled to either of the source electrode or the drain electrode with the forming the source electrode and the drain electrode, wherein the photoresist layer is also formed at the wiring.

* * * * *